United States Patent
Mori et al.

(10) Patent No.: US 7,638,853 B2
(45) Date of Patent: Dec. 29, 2009

(54) SOLID STATE IMAGING DEVICE, METHOD FOR FABRICATING THE SAME, AND CAMERA

(75) Inventors: Mitsuyoshi Mori, Kyoto (JP); Takumi Yamaguchi, Kyoto (JP); Toru Okino, Osaka (JP)

(73) Assignee: Panasonic Corporation, Osaka (JP)

( * ) Notice: Subject to any disclaimer, the term of this patent is extended or adjusted under 35 U.S.C. 154(b) by 26 days.

(21) Appl. No.: 11/826,570

(22) Filed: Jul. 17, 2007

(65) Prior Publication Data

US 2008/0029796 A1 Feb. 7, 2008

(30) Foreign Application Priority Data

Aug. 1, 2006 (JP) .............................. 2006-209486

(51) Int. Cl.
- H01L 31/062 (2006.01)
- H01L 31/113 (2006.01)
- H01L 27/146 (2006.01)
- H01L 21/00 (2006.01)
- H01L 21/336 (2006.01)
- H01L 21/76 (2006.01)
- H01L 21/762 (2006.01)

(52) U.S. Cl. ........................ 257/446; 257/233; 257/292; 257/431; 257/463; 257/464; 257/465; 257/513; 257/520; 257/E27.133; 257/E21.548; 257/E21.549; 438/57; 438/73; 438/80; 438/81; 438/430

(58) Field of Classification Search ................. None
See application file for complete search history.

(56) References Cited

U.S. PATENT DOCUMENTS

| | | | | |
|---|---|---|---|---|
| 6,140,156 A * | 10/2000 | Tsai | ............................ | 438/148 |
| 7,102,184 B2 * | 9/2006 | Rhodes | ........................ | 257/292 |
| 7,279,770 B2 * | 10/2007 | Mouli | ........................ | 257/510 |
| 7,358,108 B2 * | 4/2008 | Han et al. | ...................... | 438/60 |
| 2005/0139943 A1 * | 6/2005 | Kanbe | ........................ | 257/431 |
| 2006/0261386 A1 * | 11/2006 | Tanaka et al. | ................ | 257/292 |
| 2006/0273359 A1 * | 12/2006 | Mori | ........................... | 257/291 |
| 2007/0004076 A1 * | 1/2007 | Lee et al. | ....................... | 438/57 |
| 2007/0045679 A1 * | 3/2007 | McKee et al. | ................ | 257/291 |

FOREIGN PATENT DOCUMENTS

JP 2005-191262 7/2005

* cited by examiner

*Primary Examiner*—Andy Huynh
*Assistant Examiner*—Hoang-Quan T Ho
(74) *Attorney, Agent, or Firm*—McDermott Will & Emery LLP (57) ABSTRACT

A solid state imaging device includes: an imaging region formed in an upper part of a substrate made of silicon to have a photoelectric conversion portion, a charge accumulation region of the photoelectric conversion portion being of a first conductivity type; a device isolation region formed in at least a part of the substrate to surround the photoelectric conversion portion; and a MOS transistor formed on a part of the imaging region electrically isolated from the photoelectric conversion region by the device isolation region. The width of the device isolation region is smaller in its lower part than in its upper part, and the solid state imaging device further includes a dark current suppression region surrounding the device isolation region and being of a second conductivity type opposite to the first conductivity type.

13 Claims, 5 Drawing Sheets

SOLID STATE IMAGING DEVICE, METHOD FOR FABRICATING THE SAME, AND CAMERA

BACKGROUND OF THE INVENTION (1) Field of the Invention

The present invention relates to solid state imaging devices each including an imaging region which has a plurality of pixels over a semiconductor substrate, methods for fabricating the same, and cameras.

(2) Description of Related Art

A MOS (Metal Oxide Semiconductor) solid state imaging device is an image sensor in which a signal accumulated in a photodiode forming a corresponding pixel is read by an amplification circuit including a MOS transistor. Such a MOS solid state imaging device is advantageously capable of low voltage operation and high-speed charge reading and can be integrated with peripheral circuits into one chip.

In view of the above, attention has been paid to MOS solid state imaging devices as imaging devices used for digital cameras and portable devices, such as mobile phones. In recent years, particularly, for the MOS solid state imaging devices, reduction in cell size and improvement in sensitivity have been especially demanded.

An imaging region of a typical MOS solid state imaging device is formed of a photodiode formed in a silicon substrate, a floating diffusion, a MOS transistor, and a device isolation region for electrically isolating these elements from one another. Generally, an STI (shallow trench isolation) region is formed as the device isolation region.

The device isolation region is formed by STI in the following manner: In order to satisfy the isolation characteristics, a trench is formed in the top surface of the silicon substrate by etching, and then the trench is filled with an oxide film. In this etching, the amount of unnecessary electric charges produced even under dark conditions on which the silicon substrate is not irradiated with light increases due to etching damage, resulting in a deterioration in noise characteristics. Furthermore, to cope with the reduction in cell size, the STI structure prevents the photodiode from laterally spreading out. This decreases the number of electrons accumulable in the photodiode.

In order to solve the above-mentioned problems occurring when the isolation region is formed by STI, a solid state imaging device according to a known example which will be described below has been suggested.

Figure 7:
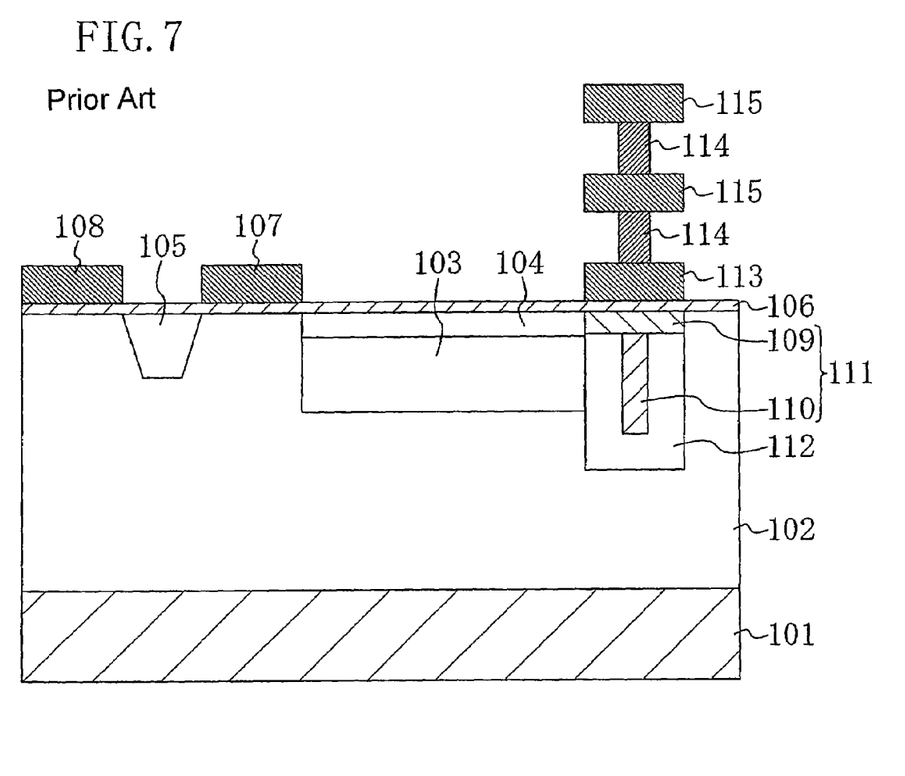
FIG. 7 is a cross-sectional view illustrating the structure of a part of a solid state imaging device of a known example including a photodiode.

FIG. 7 illustrates a cross-sectional structure of a part of a solid state imaging device including a photodiode according to the known example (for example, Japanese Unexamined Patent Application Publication No. 2005-191262).

As illustrates in FIG. 7, a P-type buried region 104 is formed in the top surface of an N-type charge accumulation region 103 formed in the top surface of a P-type semiconductor well region 102 of a semiconductor substrate 101. A trench formed in the semiconductor substrate 101 is filled with a device isolation layer 111 made of an insulating layer. The device isolation layer 111 is adjacent to a photodiode and composed of a wide upper part 109 and a narrow lower part 110. A P-type region 112 is formed to surround the narrow lower part 110. In addition to these elements, the following elements are illustrated in this figure: a floating diffusion 105; a gate insulating film 106; a read-out gate electrode 107, a reset gate electrode 108; a gate electrode 113; via interconnects 114; and metal interconnects 115.

According to the solid state imaging device illustrated in FIG. 7, the photodiode is electrically isolated from other peripheral elements in the top surface of the semiconductor substrate 101, and the width of the device isolation region can be reduced. Therefore, even when the pixel size is reduced, the amount of the accumulable charges can be sufficiently secured.

However, the solid state imaging device of the known example has problems that will be described below.

In the solid state imaging device of the known example illustrated in FIG. 7, the P-type region 112 is formed to surround the lower part 110 forming part of the device isolation layer 111 and is not connected to the P-type buried region 104. Dark current produced at the interface of the device isolation layer 111 is collected on part of the bottom surface of the upper part 109 forming part of the device isolation layer 111, i.e., at the boundary of the P-type buried region 104 and the P-type region 112, resulting in a deterioration in characteristics. Furthermore, additional dark current is produced at the upper edge of the upper part 109 forming part of the device isolation layer 111, because stresses are concentrated thereat and the upper edge are not covered with the P-type region 112. Moreover, in order to form the isolation layer 111, a lithography method and a dry etching method are used to form the upper part 109 of the device isolation layer 111, and these methods are again used to form the lower part 110 of the device isolation layer 111. For this reason, the location at which the lower part 110 is formed may become misaligned due to variations in the dimensions of a resist pattern used for the lithography method and mask misalignment. This causes the dimensions and location of the lower part 110 forming part of the device isolation layer 111 to vary from pixel to pixel and from wafer to wafer. As a result, performance variations in the number of the accumulable electrons and sensitivity are caused. This prevents a high-performance solid state imaging device from being achieved. Furthermore, since lithography needs to be carried out twice, the TAT (turn around time) is increased, resulting in increased cost.

SUMMARY OF THE INVENTION

In view of the above, an object of the present invention is to achieve, in a short TAT and at low costs, a solid state imaging device in which a charge accumulation region is secured by preventing dark current from being produced due to stress and which thus has a wide dynamic range and a method for fabricating the same.

In order to solve the above-mentioned problems, a solid state imaging device according to an aspect of the present invention includes: an imaging region formed in an upper part of a substrate made of silicon to have a photoelectric conversion portion, a charge accumulation region of the photoelectric conversion portion being of a first conductivity type; a device isolation region formed in at least a part of the substrate to surround the photoelectric conversion portion; and a MOS transistor formed on a part of the imaging region electrically isolated from the photoelectric conversion region by the device isolation region, wherein the width of the device isolation region is smaller in its lower part than in its upper part, and the solid state imaging device further comprises a dark current suppression region surrounding the device isolation region and being of a second conductivity type opposite to the first conductivity type.

According to the solid state imaging device of the aspect of the present invention, a part of the photoelectric conversion portion adjacent to the lower part of the device isolation region can be kept wider than in the known solid state imaging device. Therefore, even when the cell size is small, the amount of charges accumulable in the solid state imaging device can be increased. Furthermore, since the dark current suppression region of the second conductivity type surrounds the device isolation region, this can reduce dark current which would cause noise at the interface of the device isolation region. In other words, an electric barrier is provided between the interface of the device isolation region and the photoelectric conversion portion, thereby preventing charges from moving to the charge accumulation region.

In the solid state imaging device of the aspect of the present invention, the dark current suppression region preferably includes at least one of a surface dark current suppression region of the second conductivity type formed in the top surface of the charge accumulation region and a sidewall dark current suppression region of the second conductivity type formed to follow the shape of the device isolation region.

In the solid state imaging device of the aspect of the present invention, the sidewall dark current suppression region may be formed below the bottom surface of the upper part of the device isolation region.

Thus, a region of the second conductivity type can be formed below the bottom surface of the upper part of the device isolation region. This can prevent unnecessary charges produced at the upper edge of the upper part of the device isolation region at which stress is concentrated from moving to the charge accumulation region.

In the solid state imaging device of the aspect of the present invention, an active region functioning as one of a source and drain of the MOS transistor may be formed above the bottom surface of the upper part of the device isolation region.

With this configuration, an impurity is implanted only into the active region functioning as one of a source and drain of the MOS transistor used for each pixel. The upper part of the device isolation region is deep enough to prevent the impurity from moving below the upper part of the device isolation region. This depth prevents the impurity from being implanted into the photoelectric conversion portion.

In the solid state imaging device of the aspect of the present invention, the upper part of the device isolation region is formed above the bottom surface of the surface dark current suppression region.

This configuration can prevent unnecessary charges produced at the interface of the device isolation region from moving to the charge accumulation region and prevent the impurity to be implanted into the active region serving as one of a source and drain of an associated MOS transistor from being implanted into the photodiode.

In the solid state imaging device of the aspect of the present invention, the thickness of the surface dark current suppression region may be smaller than that of the sidewall dark current suppression region between the device isolation region and the charge accumulation region.

Thus, since the dark current suppression region is small, this increases the area occupied by an associated depletion layer. Therefore, the number of charges accumulable in the solid state imaging device is increased.

In the solid state imaging device of the aspect of the present invention, the thickness of the surface dark current suppression region may be larger than that of the sidewall dark current suppression region between the device isolation region and the charge accumulation region.

This configuration allows the charge accumulation region to be spatially away from the interface of the device isolation region damaged due to etching. This isolation can prevent unnecessary charges produced under dark conditions from flowing into the charge accumulation region.

In the solid state imaging device of the aspect of the present invention, the lower part of the device isolation region is preferably formed in a self-alignment manner to fall within the planar area of the upper part of the device isolation region.

Thus, pixels each have substantially the same device isolation structure, and therefore the extent to which a depletion layer of the photoelectric conversion portion laterally spreads out also does not vary among pixels.

It is preferable that the solid state imaging device of the aspect of the present invention further includes an impurity region containing impurities of the first conductivity type, said impurity region being between the lower part of the device isolation region and the charge accumulation region.

This configuration allows the photoelectric conversion portion to laterally spread out as compared with the known solid state imaging device using the known device isolation structure (STI). This increases the amount of charges accumulable in the photoelectric conversion portion. Furthermore, the characteristics of the solid state imaging device can be improved in the same ion implantation process for the formation of the photoelectric conversion portion as in the known art, i.e., by simply changing the mask layout.

In the above-mentioned case, the number of the impurities of the first conductivity type in the impurity region is preferably greater than that of impurities of the first conductivity type in the charge accumulation region.

Since the photoelectric conversion portion therefore laterally spreads out, this increases the amount of charges accumulable in the photoelectric conversion portion.

In the solid state imaging device of the aspect of the present invention, the lower part of the device isolation region may be filled with a silicon film containing impurities of the second conductivity type, and the upper part of the device isolation region may be filled with an insulating film.

When, as described above, silicon serving as a material exhibiting excellent space-filling characteristics is used for the lower part of the device isolation region, this can reduce the width of the lower part. Furthermore, since the upper part of the device isolation region is filled with an insulating film, this can suppress signal transmission delay arising from the influence of a parasitic capacitance even with a polysilicon interconnect for signal transmission placed on the device isolation region.

In the solid state imaging device of the aspect of the present invention, the device isolation region may be filled with an insulating film.

This configuration can suppress signal transmission delay arising from the influence of a parasitic capacitance even with a polysilicon interconnect for signal transmission placed on the device isolation region.

It is preferable that the solid state imaging device of the aspect of the present invention further includes a thermally oxidized film at the interface of the device isolation region.

Thus, the upper edge of the upper part of the device isolation region become rounded. This can inhibit electric field crowding between the MOS transistor and the silicon substrate, resulting in improvement in the stability of the operation of the MOS transistor.

A camera according to another aspect of the present invention includes the solid state imaging device.

Still another aspect of the present invention provides a method for fabricating a solid state imaging device including an imaging region formed in an upper part of a substrate made of silicon to have a photoelectric conversion portion, a charge accumulation region of the photoelectric conversion portion being of a first conductivity type; a device isolation region formed in at least a part of the substrate to surround the photoelectric conversion portion; and a MOS transistor formed on a part of the imaging region electrically isolated from the photoelectric conversion region by the device isolation region. The method includes the steps of: forming a mask pattern on the substrate, the mask pattern having an opening; etching the substrate using the mask pattern, thereby forming a first isolation trench in the substrate; forming a sidewall on a side surface of the first isolation trench; and etching the substrate using the sidewall as a mask, thereby forming a second isolation trench in the substrate.

According to the above-mentioned method, the lower part of the device isolation region is formed in a self-alignment manner. Therefore, the configuration of the solid state imaging device in which the characteristics of respective photoelectric conversion portions of pixels do not vary can be achieved. Furthermore, this configuration can be achieved by only one lithography process. Therefore, the TAT is short.

It is preferable that the method further includes the step of after the formation of the second isolation trench, removing the sidewall and forming a dark current suppression region of a second conductivity type to surround the device isolation region, the second conductivity type being opposite to the first conductivity type.

Thus, the dark current suppression region of the second conductivity type can be secured around the device isolation region. Consequently, the photoelectric conversion portion laterally spreads out, resulting in an increase in the amount of charges accumulable in the photoelectric conversion portion.

The method may further include, after the formation of the dark current suppression region, the steps of: thermally oxidizing a part of the substrate exposed at the first and second isolation trenches, thereby forming a silicon oxide film; and after the formation of the silicon oxide film, filling the first and second isolation trenches with an insulating film, thereby forming the device isolation region.

Thus, even when the second isolation trench associated with the lower part of the device isolation region is narrow, it can be filled with a silicon material, and further the first isolation trench associated with the upper part thereof can be filled with an insulating film.

The method may further include, after the formation of the dark current suppression region, the steps of: thermally oxidizing a part of the substrate exposed at the first and second isolation trenches, thereby forming a silicon oxide film; and after the formation of the silicon oxide film, filling at least a part of a combination of the first and second isolation trenches corresponding to a lower part of the device isolation region with a silicon film and then filling the remaining part of the combination of the first and second isolation trenches with an insulating film, thereby forming the device isolation region.

Thus, the first and second isolation trenches associated with the device isolation region can be filled with an insulating film.

The method may further include the steps of: forming the photoelectric conversion portion in a part of the substrate; and forming the MOS transistor on a region of the substrate electrically isolated by the device isolation region.

Thus, each pixel can be formed with the MOS transistor that can detect charges accumulated in the photoelectric conversion portion.

As described above, the present invention can provide the following solid state imaging device and the method for fabricating the same. The solid state imaging device secures the electrical isolation characteristics of a device isolation region. At the same time, even with miniaturization in the pixel size, the amount of dark current and the number of white blemishes both determining the characteristics of a photoelectric conversion portion of the solid state imaging device are small, and the number of electrons accumulable in the photoelectric conversion portion increases.

DETAILED DESCRIPTION OF THE INVENTION

First, a description will be given of the principal circuit configuration common to MOS solid state imaging devices according to an embodiment of the present invention.

Figure 1:
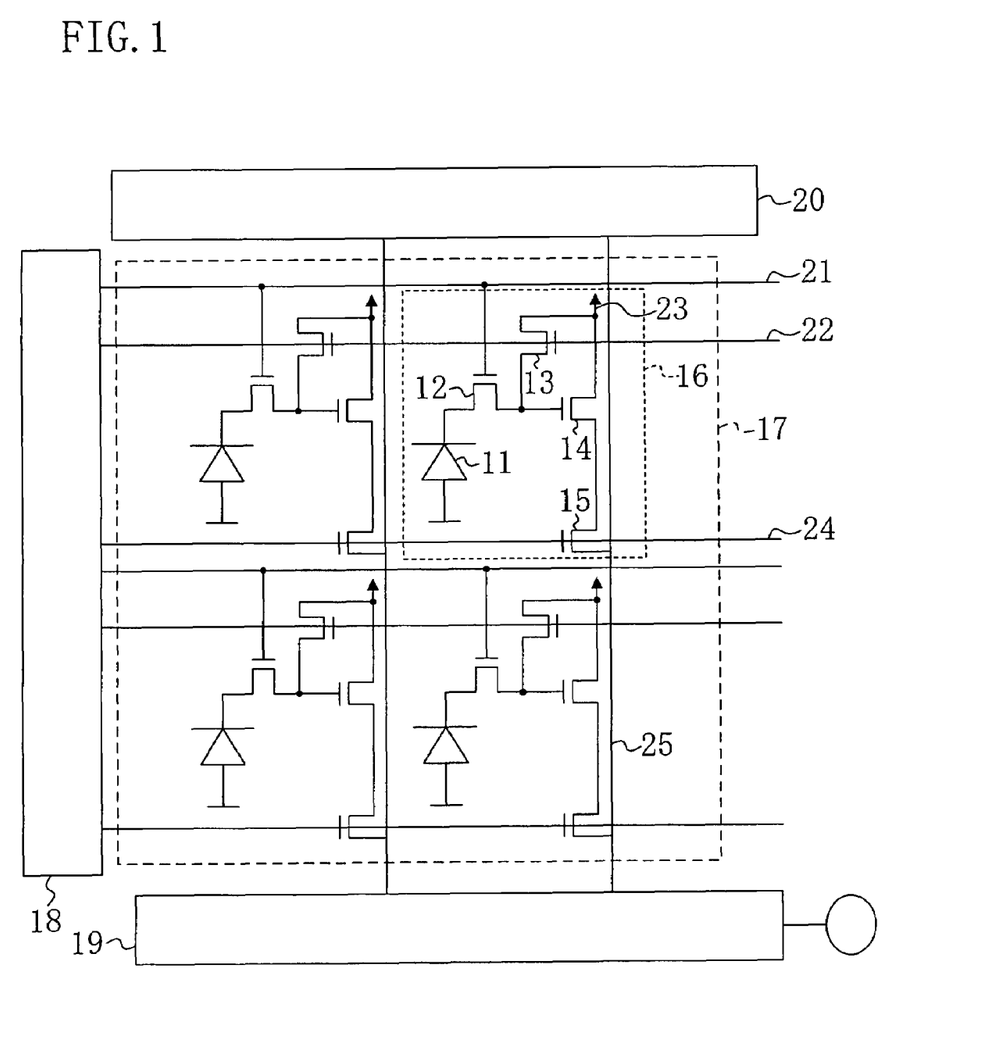
FIG. 1 is a principal circuit configuration diagram of a solid state imaging device according to an embodiment of the present invention.

FIG. 1 illustrates the principal circuit configuration of a MOS solid state imaging device.

As illustrated in FIG. 1, the following elements are located on one substrate (not shown): an imaging region 17 in which a plurality of pixels 16 are arranged in a matrix; a vertical shift register 18 for selecting the pixels 16; a horizontal shift register 19 for outputting signals; and a timing generation circuit 20 for supplying necessary pulses to the vertical and horizontal shift registers 18 and 20.

Each of the pixels 16 arranged over the imaging region 17 is formed of a photodiode (photoelectric conversion portion) 11 for photoelectric conversion and a MOS transistor accompanying thereto. Electric charges photoelectrically converted in the photodiode 11 are transferred by a transfer transistor 12 to a floating diffusion section (not shown) forming a floating diffusion layer. The drain of the floating diffusion section also serves as the source of a reset transistor 13 which is connected to a power supply 23. The gate of an amplification transistor 14 is connected to the floating diffusion section, and the drain of the amplification transistor 14 is connected to the power supply 23. The source of the amplification transistor 14 is connected to the drain of a selection transistor 15. The source of the selection transistor 15 is connected to an output signal line 25.

The gate of the transfer transistor 12, the gate of the reset transistor 13, and the gate of the selection transistor 15 are respectively connected to output pulse lines 21, 22, and 24 extending from the vertical shift register 18.

The specific characteristics of a MOS solid state imaging device according to the present invention will be described hereinafter.

EMBODIMENT

A solid state imaging device according to an embodiment of the present invention will be described hereinafter with reference to the drawings.

Figure 2:
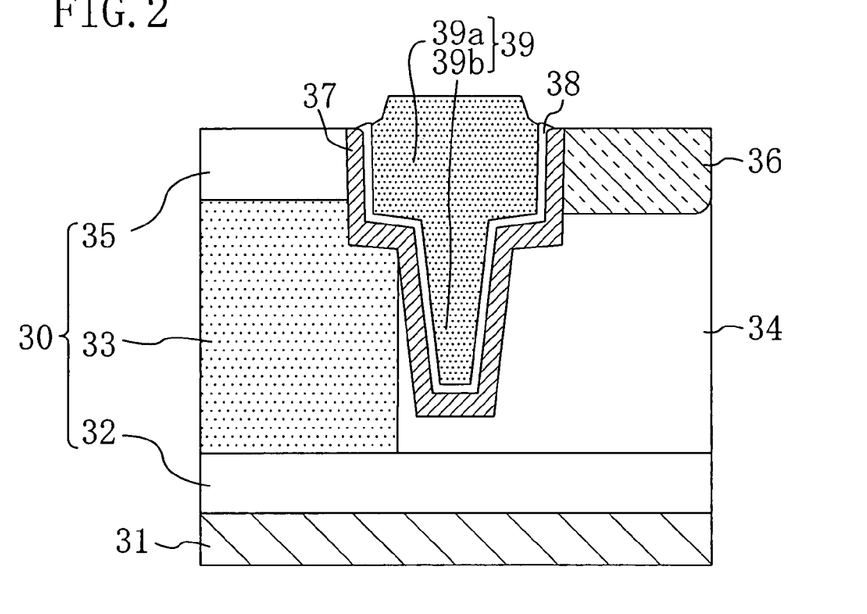
FIG. 2 is a cross-sectional view illustrating the structure of a part of a solid state imaging device including a photodiode according to the embodiment of the present invention.
Figure 3:
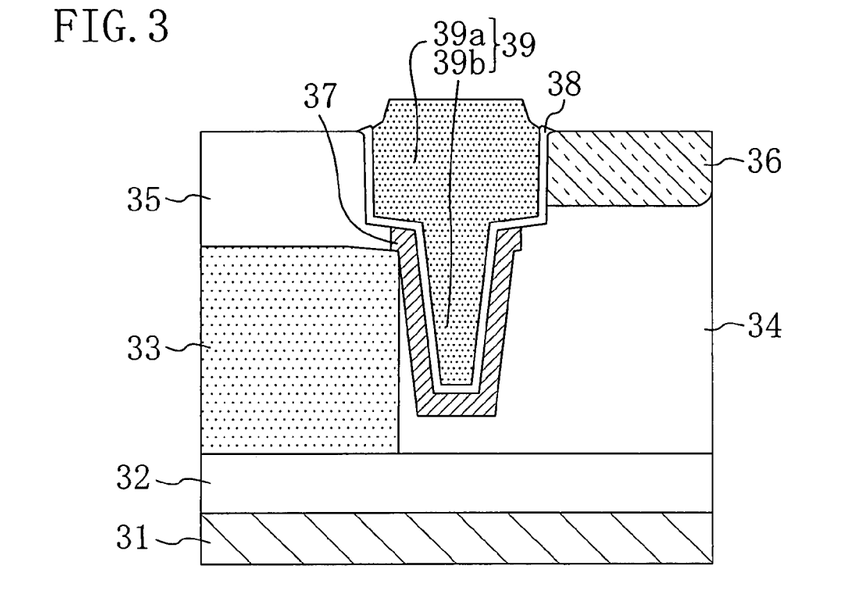
FIG. 3 is a cross-sectional view illustrating the structure of a part of another solid state imaging device including a photodiode according to the embodiment of the present invention.
Figure 4:
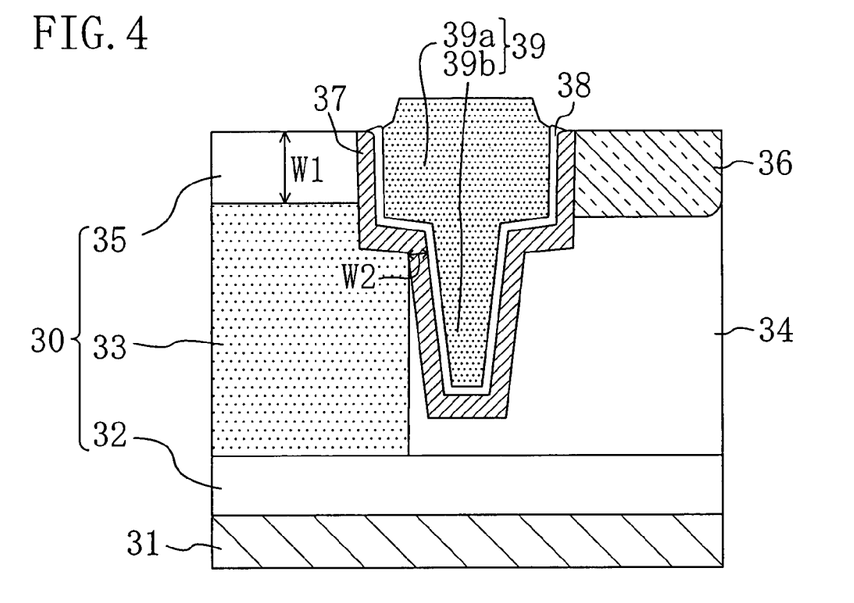
FIG. 4 is a cross-sectional view illustrating the structure of a part of still another solid state imaging device including a photodiode according to the embodiment of the present invention.
Figure 5:
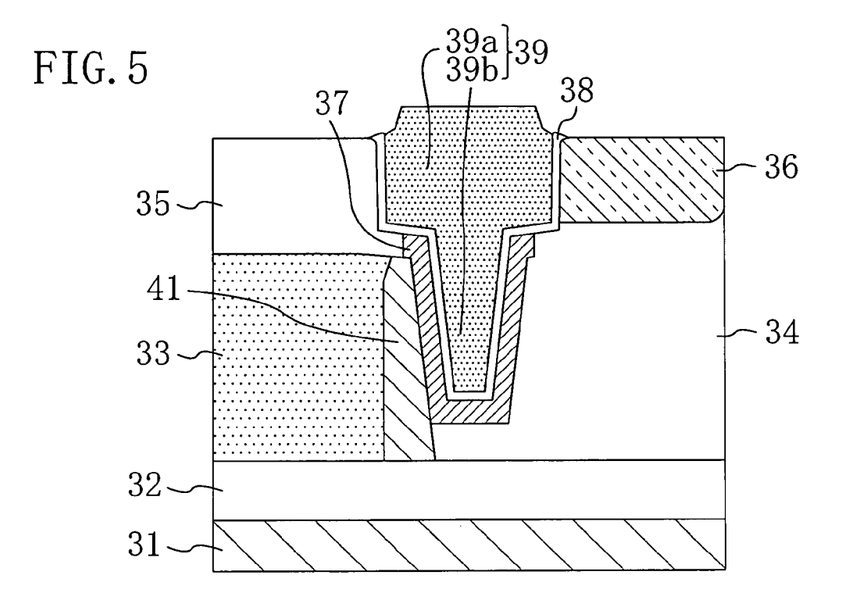
FIG. 5 is a cross-sectional view illustrating the structure of a part of yet another solid state imaging device including a photodiode according to the embodiment of the present invention.

FIG. 2 illustrates a cross-sectional structure of a part of the solid state imaging device including a photodiode and an active region according to the embodiment of the present invention. Interconnects and interlayer films formed on a semiconductor substrate are not shown. FIGS. 3 through 5 that will be described below illustrate modifications of the embodiment of the present invention. Like FIG. 2, these figures each illustrate a cross-sectional structure of a part of a solid state imaging device including a photodiode and an active region.

As illustrated in FIG. 2, a photodiode 30 serving as a photoelectric conversion portion of the solid state imaging device has a P$^+$NP$^-$ structure in the top surface of the silicon substrate 31. The P$^+$NP$^-$ structure includes a P$^+$ surface layer (a region of the silicon substrate 31 in which dark current produced at the surface thereof is suppressed (hereinafter, referred to as "surface dark current suppression region")) 35 provided at the uppermost level of the silicon substrate 31, and an N-type silicon layer (charge accumulation region) 33 and a P$^-$ silicon layer 32 sequentially provided under the P$^+$ surface layer 35.

When light impinging on the photodiode 30 reaches a PN junction interface, the light is photoelectrically converted to holes and electrons. Thus, signal charges (electrons) are accumulated principally in a depletion layer region between the N-type silicon layer 33 and the P$^+$ surface layer 35, a depletion layer region between the N-type silicon layer 33 and the P$^-$ silicon layer 32, and a depletion layer region between a P$^+$ sidewall layer (a region of the silicon substrate 31 in which dark current produced at the sidewall thereof is suppressed (hereinafter, referred to as "sidewall dark current suppression region")) 37 and the N-type silicon layer 33 according to the amount of the impinging light. The P$^+$ surface layer 35 provided at the uppermost level provides an electric barrier to prevent electric charges randomly generated at the top surface of the photodiode 30 due to any factor, such as thermal energy arising from crystal defects, from being mixed with the photoelectrically converted and accumulated electric charges.

The electric charges accumulated in the photodiode 30 are read out using a MOS transistor (see, for example, FIG. 1) adjacent to the photodiode 30. In order to electrically isolate the photodiode 30 from an active region 36 serving as the source or drain of the MOS transistor, a device isolation region 39 is formed to have an upper part 39$a$ and a lower part 39$b$ which is much narrower than the upper part 39$a$. The P$^+$ sidewall layer 37 is formed to surround the upper part 39$a$ and the lower part 39$b$ of the device isolation region 39 and, like the P$^+$ surface layer 35, provides an electric barrier to prevent electric charges randomly generated at the interface of the silicon substrate 31 in contact with the device isolation region 39 from being mixed with the photoelectrically converted and accumulated electric charges. In view of the above, the P$^+$ sidewall layer 37 is required to improve the performance of the solid state imaging device. Furthermore, this P$^+$ sidewall layer 37 provides electrical connection between the P$^+$ surface layer 35 and a P-type silicon layer 34.

A sidewall oxide film 38 is formed between the device isolation region 39 and the P$^+$ sidewall layer 37 by thermal oxidation that will be described below. The sidewall oxide film 38 is formed, at its part corresponding to the upper edge of the upper part 39$a$ of the device isolation region 39, with a bird's peak. This structure can decrease the hump characteristics.

As described above, the device isolation region 39 has the upper part 39$a$ and the lower part 39$b$ which is much narrower than the upper part 39$a$. As illustrated in FIG. 2, the device isolation region 39 has a stepped structure in which the width of the device isolation region 39 becomes smaller in a downward direction. Thus, in particular, the following two effects can be expected.

More particularly, first, since the width of the device isolation region 39 is reduced downward, the P$^+$ sidewall layer 37 is formed to follow the lower part 39$b$ having a smaller width than the upper part 39$a$. This can ensure a wider N-type silicon layer 33 than a known N-type silicon layer. In other words, the amount of charges accumulable in the charge accumulation region can be increased even when the cell size is reduced. The reason for this is as follows. A reduction in cell size provides a narrow channel effect, and therefore the area occupied by the N-type silicon layer 33 is significantly reduced due to thermal diffusion of P$^+$-type impurities. However, since the P$^+$ sidewall layer 37 is formed to follow the lower part 39$b$ of the device isolation region 39 having a smaller width than the upper part 39$a$, this allows the area occupied by the N-type silicon layer 33 to be kept sufficiently wide.

Second, since the side and bottom surfaces of the device isolation region 39 are covered with the P$^+$ sidewall layer 37, the P$^+$ sidewall layer 37 serves as an electric barrier against the N-type silicon layer 33. The existence of the P$^+$ sidewall layer 37 containing the same amount of P-type impurities as that of N-type impurities in the N-type silicon layer 33 allows the device isolation region 39 to be spatially away from the N-type silicon layer 33 as compared with a known STI structure. This can prevent unnecessary charges which would cause noise from flowing into the N-type silicon layer 33.

The P$^+$ surface layer 35 may have a structure as illustrated in FIG. 3 instead of the structure illustrated in FIG. 2. More particularly, it may be configured such that its bottom is located below the bottom of the upper part 39$a$ of the device isolation region 39. This can further prevent unnecessary charges which would be produced under dark conditions due to stress concentration at the upper part 39$a$ of the device isolation region 39 from flowing into the N-type silicon layer 33. Furthermore, when the contact area between the P$^+$ surface layer 35 and the P$^+$ sidewall layer 37 is increased, this stabilizes the electric potential of the P$^+$ surface layer 35.

Furthermore, the P$^+$ sidewall layer 37 may have a structure as illustrated in FIG. 3 instead of the structure illustrated in FIG. 2. More particularly, it may cover only the lower part 39$b$ of the device isolation region 39. This decreases the junction area between the P$^+$ sidewall layer 37 and the active region 36, resulting in improved junction breakdown voltage. Moreover, since the area occupied by the P$^+$ sidewall layer 37 decreases as compared with that in the structure illustrated in FIG. 2, the area occupied by the N-type silicon layer 33 is kept sufficiently wide. Therefore, even with a reduction in the cell size, the amount of the accumulable charges can be increased.

Moreover, the active region 36 may have a structure as illustrated in FIG. 3 instead of the structure illustrated in FIG. 2. More particularly, it may be configured such that its bottom is located above the bottom of the upper part 39$a$ of the device isolation region 39. Thus, like the known STI structure, even with mask misalignment, N-type impurities can be implanted into a region of the solid state imaging device that will be the active region 36 without being implanted into the photodiode 30.

The above-described structures allow the solid state imaging device of this embodiment to specifically provide the following effects.

First, the solid state imaging device of this embodiment illustrated in FIG. 2 and the known solid state imaging device wherein the STI is used as a device isolation region were compared to each other in terms of the number of white blemishes being in correlation with the amount of unnecessary charges produced under dark conditions. This comparison showed that the number of white blemishes in the solid state imaging device of this embodiment is reduced to 30% or less of that in the known solid state imaging device.

Likewise, the solid state imaging device of this embodiment illustrated in FIG. 3 and the known solid state imaging device wherein the STI is used as a device isolation region were compared to each other in terms of the number of white blemishes being in correlation with the amount of unnecessary charges produced under dark conditions. This comparison showed that the number of white blemishes in the solid state imaging device of this embodiment is reduced to 40% or less of that in the known solid state imaging device.

Both of the solid state imaging devices of this embodiment illustrated in FIGS. 2 and 3 have substantially the same device-to-device electrical isolation characteristics as the known solid state imaging device and each exhibit a breakdown voltage of 6 V or more. In the above case, the number of white blemishes represents the number of pixels whose output is 10 mV or more in the absence of impinging light.

The number of accumulable electrons in the solid state imaging device of this embodiment illustrated in FIG. 2 is 1.2 times or more greater than that in the known solid state imaging device. The number of accumulable electrodes in the solid state imaging device of this embodiment illustrated in FIG. 3 is 1.3 times or more greater than that in the known solid state imaging device. Referring to FIGS. 2 and 3, in order to laterally extend the N-type silicon layer 33, N-type impurities are implanted into the silicon substrate 31 such that that the N-type silicon layer 33 formed of the N-type impurities is partially located under the upper part 39a of the device isolation region 39.

As illustrated in FIG. 5, in order to further laterally extend the photodiode 30 of the solid state imaging device of this embodiment illustrated in FIG. 3, an N-type additional impurity region 41 may be formed under the upper part 39a of the device isolation region 39 by lithography and ion implantation after the formation of the N-type silicon layer 33. In this way, the number of accumulable charges in the solid state imaging device of this embodiment illustrated in FIG. 5 becomes 1.4 times or more greater than that in the known solid state imaging device wherein the STI is used for the device isolation region.

Furthermore, when, as illustrated in FIG. 4, the thickness of the P$^+$ surface layer 35 is represented as W1 and the minimum distance between the device isolation region 39 and the N-type silicon layer 33 is represented as W2, the following effects are realized according to the relationship between the thickness W1 and the distance W2. More particularly, when the thickness W1 is smaller than the distance W2, the number of accumulable electrons becomes 1.3 times or more greater than that in the known solid state imaging device wherein the STI is used for the device isolation region. The reason for this is that a depletion layer extends toward the top surface of the silicon substrate 31 and reaches the top surface thereof. On the other hand, when, as illustrated in FIG. 4, the thickness W1 is larger than the distance W2, a depletion layer is prevented from extending toward the top surface of the silicon substrate 31 and reaching the top surface thereof. This improves the performance of preventing unnecessary charges produced at the top surface of the silicon substrate 31 under dark conditions from flowing into the N-type silicon layer 33. This improvement reduces the number of white blemishes correlated with the flow of unnecessary charges into the N-type silicon layer 33 to 50% or less as compared with the known solid state imaging device wherein the STI is used.

A fabrication method for the solid state imaging device according to the embodiment of the present invention will be described hereinafter with reference to the drawings.

FIGS. 6A through 6F are cross-sectional views principally illustrating a fabrication method for a device isolation region 39 which is a feature of the solid state imaging device according to the embodiment of the present invention.

Figure 6A:
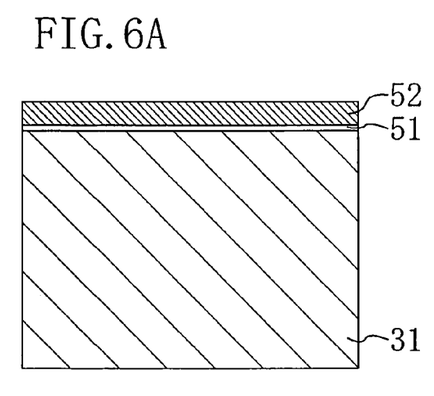
FIGS. 6A through 6F are cross-sectional views sequentially illustrating process steps in a fabrication method for a part of the solid state imaging device including a photodiode according to the embodiment of the present invention.

First, as illustrated in FIG. 6A, a pad insulating film 51 made of an approximately 1-nm- through 50-nm-thick silicon oxide film is formed on a silicon substrate 31. Subsequently, an anti-oxidization film 52 made of an approximately 50-nm-through 400-nm-thick silicon nitride film or any other film is formed on the pad insulating film 51.

Figure 6B:
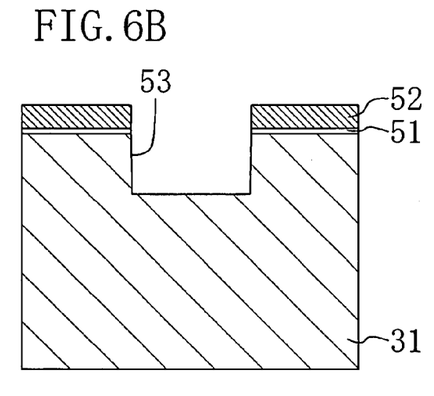

Next, as illustrated in FIG. 6B, a resist pattern (not shown) is formed on the anti-oxidization film 52 to have an opening in its predetermined region, and then the pad insulating film 51 and the anti-oxidization film 52 are selectively removed by etching using the resist pattern as a mask to expose a predetermined region of the silicon substrate 31. Thereafter, the resist pattern is removed. Subsequently, an opening (first isolation trench) 53 is formed in the top surface of the silicon substrate 31 by using the anti-oxidization film 52 as a hard mask film. The width of the opening 53 is approximately 0.10 through 10.0 μm and depends on the size of a pixel to be developed and the CMOS process rule. A description was given herein of a case where an opening 53 is formed using an anti-oxidization film 52 as a hard mask film after removal of a resist pattern. However, the opening 53 may be formed without removing the resist pattern. Although, in this embodiment, the silicon nitride film is used as the hard mask film, a silicon oxide film may be used instead. Furthermore, a resist film may be used instead of the silicon nitride film.

The area occupied by the opening 53 will be an upper part 39a of a device isolation region 39 (see, for example, FIG. 2). Although the number of white blemishes can be reduced, in particular, by making the depth of the opening 53 (the depth of the upper part 39a of the device isolation region 39) smaller than that of a P$^+$ surface layer 35, the depth of the opening 53 may be larger than that of the P$^+$ surface layer 35. When the depth of the opening 53 is larger than that of an active region 36 that will be formed later, N-type impurities forming an active region 36 can be implanted into the silicon substrate 31 in substantially the same process as that in the known fabrication method for a solid state imaging device wherein the STI is used. In other words, even with mask misalignment, N-type impurities are prevented from being implanted into a photodiode 30. When the depth of the opening 53 is smaller than that of the active region 36, a photodiode region needs to be covered with a resist by lithography in order to prevent impurities forming the active region 36 from being implanted into the photodiode 30. When dry etching is carried out using the resist as a mask, the resist is removed after this dry etching.

Figure 6C:
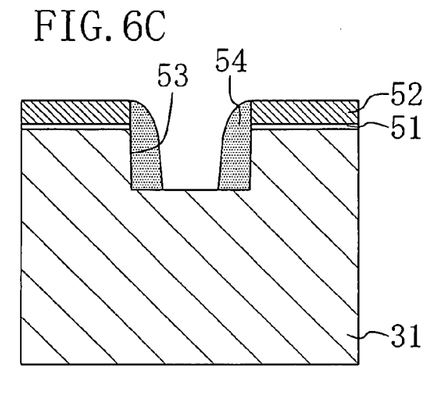

Next, as illustrated in FIG. 6C, an approximately 10-nm- through 300-nm-thick oxide film is entirely formed on the silicon substrate 31, and then a sidewall 54 is formed on the side surfaces of the opening 53 by etching the oxide film. The thickness of the oxide film needs to be adjusted such that the width of a lower part 39b of the device isolation region 39 to be formed later satisfies the electric characteristics, low-noise characteristics, and wide dynamic range characteristics.

Figure 6D:
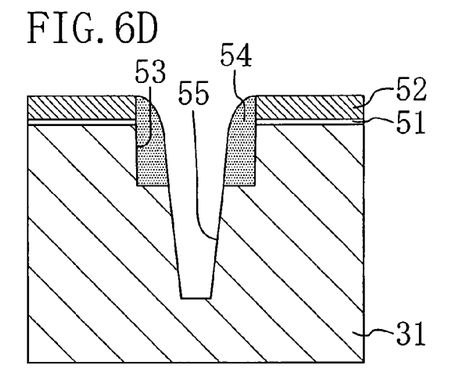

Next, as illustrated in FIG. 6D, an opening (second isolation trench) 55 corresponding to a region of the solid state imaging device forming the lower part 39b of the device isolation region 39 is formed in the silicon substrate 31 by dry etching using the sidewall 54 as a mask. In this case, the opening 55 is formed by utilizing the etching selectivity between the sidewall 54 made of an oxide film and the silicon substrate 31. Therefore, the lower part 39b of the device isolation region 39 that will be formed by filling the opening 55 later can be formed in a self-alignment manner. This reduces variations in structure among parts of the device isolation region 39 surrounding different photodiodes.

Figure 6E:
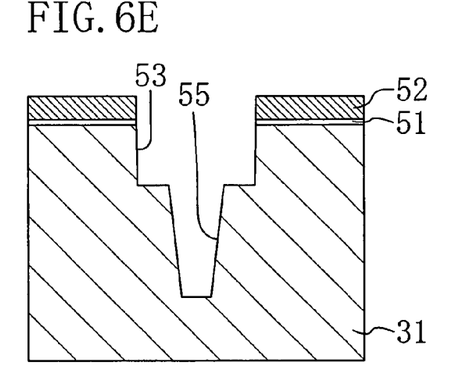

Next, as illustrated in FIG. 6E, the sidewall 54 is removed by etching.

Figure 6F:
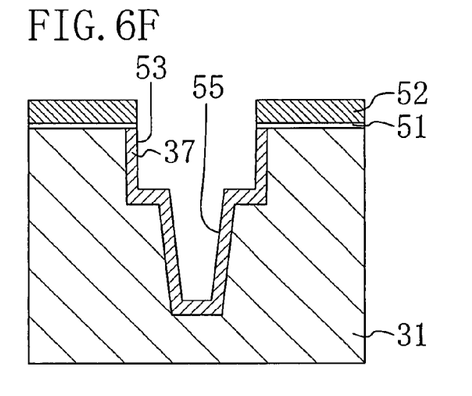

Next, as illustrated in FIG. 6F, a sidewall oxide film 38 (not shown in FIGS. 6A through 6F) is formed by thermal oxidation to cover the side and bottom surfaces of the opening 53 that will be a region of the solid state imaging device forming the upper part 39a of the device isolation region 39 and the side and bottom surfaces of the opening 55 that will be a region thereof forming the lower part 39b of the device isolation region 39. Then, a P$^+$ sidewall layer 37 is formed at the interface of the device isolation region 39 to surround the device isolation region 39. The formation of the sidewall oxide film 38 in the above-mentioned manner can inhibit electric field crowding between the gate of a MOS transistor and the silicon substrate 31, resulting in improvement in the stability of the operation of the MOS transistor. Since the P$^+$ sidewall layer 37 is formed using the anti-oxidation film 52 as a mask, it can be formed in a self-alignment manner without lithography. In this embodiment, boron serving as a P-type impurity is implanted into a region of the silicon substrate 31 in which the P$^+$ sidewall layer 37 is to be formed with an implantation energy of 2.0 KeV through 50 KeV at a dose of $1\times10^{11}$/cm$^2$ through $1\times10^{15}$/cm$^2$. In this way, the P$^+$ sidewall layer 37 is formed on the surface of a part of the silicon substrate 31 corresponding to the side and bottom surfaces of the device isolation region 39.

In the process steps illustrated in FIGS. 6A through 6F, after the process step illustrated in FIG. 6D, boron is implanted into the wall surface of the opening 55 to form a P$^+$ sidewall layer 37 without removing the sidewall 54, thereby achieving the configurations illustrated in FIGS. 3 and 5, i.e., the configuration in which the P$^+$ sidewall layer 37 is prevented from surrounding the upper part 39a of the device isolation region 39.

Next, the openings 53 and 55 are filled with an insulating film, thereby forming the device isolation region 39 having the upper part 39a and the lower part 39b which is narrower than the upper part 39a. When the width of the opening 55 is 300 nm or less, the width of the lower part 39b is significantly reduced depending on the CMOS process rule. Therefore, the opening 55 can be filled with a silicon material exhibiting excellent space-filling characteristics. When, in this case, the silicon material is allowed to contain a P-type impurity, the P-type impurity is diffused into the silicon substrate due to heat treatment during the fabrication process for the solid state imaging device. However, since only N-channel MOS transistors are used for pixel regions, this prevents the isolation characteristics of the device isolation region 39 from being deteriorated. Thereafter, part of the silicon material on the anti-oxidization film 52 is removed by etching the entire surface of the wafer. Then, the opening 53 that will be the upper part 39a of the device isolation region 39 is filled with an insulating film. An interconnect can be formed on the device isolation region 39 so as to be connected to the gate of associated one of the MOS transistors. The total depth of the device isolation region 39 is 150 through 500 nm. The anti-oxidization film 52 and the pad insulating film 51 are partially removed by chemical mechanical polishing (CMP) or dry etching, and then the respective remaining parts of the anti-oxidization film 52 and the pad insulating film 51 is removed by wet etching. Thereafter, an N-type silicon layer 33, a P$^+$ surface layer 35, a P$^-$ silicon layer 32, a P$^+$ sidewall layer 37, a P-type silicon layer 34, and an active region 36 are formed in desired regions by ion implantation. As a result, associated one of the configurations illustrated in FIGS. 2 through 4 is obtained.

Subsequently, although not shown, gate insulating films, N-type gate interconnects, interlayer dielectrics, signal lines, pulse transmission lines, and other elements are formed according to a well-known method. Through the above steps, the solid state imaging device of this embodiment can be fabricated.

Furthermore, a camera including a solid state imaging device having the above-mentioned configuration can take clear pictures.

According to the solid state imaging device of the present invention, the fabrication method for the same, and the camera using the solid state imaging device, random noise and white blemishes which would result from charges generated due to the upper edge and interface of the device isolation region can be prevented to achieve the solid state imaging device exhibiting high sensitivity, and the number of electrons accumulable in the solid state imaging device can be increased even with a reduction in the cell size. In view of the above, the solid state imaging device of the present invention, the fabrication method for the same, and the camera using the solid state imaging device are useful for solid state imaging devices each including an imaging region which has a plurality of pixels over a semiconductor substrate, methods for fabricating the same, and cameras.

What is claimed is:

1. A solid state imaging device comprising:
    an imaging region formed in an upper part of a substrate made of silicon to have a photoelectric conversion portion, a charge accumulation region of the photoelectric conversion portion being of a first conductivity type;
    a device isolation region formed in at least a part of the substrate to surround the photoelectric conversion portion; and
    a MOS transistor formed on a part of the imaging region electrically isolated from the photoelectric conversion region by the device isolation region,
    wherein the width of the device isolation region is smaller in its lower part than in its upper part and discontinuously changes from the upper part to the lower part,
    the solid state imaging device further comprises a dark current suppression region surrounding the device isolation region and being of a second conductivity type opposite to the first conductivity type,
    the dark current suppression region includes a surface dark current suppression region of the second conductivity type formed at the top surface of the charge accumulation region, and
    a bottom portion of the upper part of the device isolation region is located above a bottom surface of the surface dark current suppression region.

2. The solid state imaging device of claim 1, wherein
the dark current suppression region includes a sidewall dark current suppression region of the second conductivity type formed to follow the shape of the device isolation region.

3. The solid state imaging device of claim 2, wherein
the sidewall dark current suppression region is formed below a bottom surface of the upper part of the device isolation region.

4. The solid state imaging device of claim 1, wherein
an active region functioning as one of a source and drain of the MOS transistor is formed above a bottom surface of the upper part of the device isolation region.

5. The solid state imaging device of claim 2, wherein
a thickness of the surface dark current suppression region is smaller than that of the sidewall dark current suppression region between the device isolation region and the charge accumulation region.

6. The solid state imaging device of claim 2, wherein
a thickness of the surface dark current suppression region is larger than that of the sidewall dark current suppression region between the device isolation region and the charge accumulation region.

7. The solid state imaging device of claim 1, wherein
the lower part of the device isolation region is formed in a self-alignment manner to fall within a planar area of the upper part of the device isolation region.

8. The solid state imaging device of claim 1 further comprising
an impurity region containing impurities of the first conductivity type, said impurity region being between the lower part of the device isolation region and the charge accumulation region.

9. The solid state imaging device of claim 8, wherein
the number of the impurities of the first conductivity type in the impurity region is greater than that of impurities of the first conductivity type in the charge accumulation region.

10. The solid state imaging device of claim 1, wherein
the lower part of the device isolation region is filled with a silicon film containing impurities of the second conductivity type, and
the upper part of the device isolation region is filled with an insulating film.

11. The solid state imaging device of claim 1, wherein
the device isolation region is filled with an insulating film.

12. The solid state imaging device of claim 1 further comprising
a thermally oxidized film at the interface of the device isolation region.

13. A camera including the solid state imaging device of claim 1.

* * * * *